United States Patent
Park et al.

(10) Patent No.: US 12,085,383 B2
(45) Date of Patent: *Sep. 10, 2024

(54) OVERLAY MEASUREMENT DEVICE

(71) Applicant: AUROS TECHNOLOGY, INC., Hwaseong-si (KR)

(72) Inventors: Gyu Nam Park, Goyang-si (KR); Hyeon Gi Shin, Hwaseong-si (KR); Seung Soo Lee, Hwaseong-si (KR)

(73) Assignee: AUROS TECHNOLOGY, INC., Hwaseong-si (KR)

( * ) Notice: Subject to any disclaimer, the term of this patent is extended or adjusted under 35 U.S.C. 154(b) by 249 days.

This patent is subject to a terminal disclaimer.

(21) Appl. No.: 17/641,602

(22) PCT Filed: Sep. 8, 2020

(86) PCT No.: PCT/KR2020/012096
§ 371 (c)(1),
(2) Date: Mar. 9, 2022

(87) PCT Pub. No.: WO2021/049845
PCT Pub. Date: Mar. 18, 2021

(65) Prior Publication Data
US 2022/0326008 A1    Oct. 13, 2022

(30) Foreign Application Priority Data

Sep. 10, 2019  (KR) .......... 10-2019-0111950

(51) Int. Cl.
*G01B 11/27* (2006.01)
*G01B 11/06* (2006.01)
(Continued)

(52) U.S. Cl.
CPC .......... *G01B 11/27* (2013.01); *G01B 11/0608* (2013.01); *G03F 7/70633* (2013.01);
(Continued)

(58) Field of Classification Search
CPC  G01B 11/27; G01B 11/0608; G01B 2210/56; G01B 11/02; G03F 7/70633;
(Continued)

(56) References Cited

U.S. PATENT DOCUMENTS 8,432,541 B2 *  4/2013  Rich .................. G01N 15/1434
356/73
11,835,865 B2 *  12/2023  Shin .................. G03F 7/706849
(Continued)

FOREIGN PATENT DOCUMENTS

EP      3470923 A1     4/2019
JP      H0348104 A     3/1991
(Continued)

*Primary Examiner* — Isiaka O Akanbi
(74) *Attorney, Agent, or Firm* — NKL LAW; Jae Youn Kim

(57) ABSTRACT

An overlay measurement device measures an error between a first overlay mark and a second overlay mark respectively formed on different layers formed on a wafer. The device is configured to detect a height of the first overlay mark based on a change in the signal of the first detector according to a change in the relative position of the objective lens with respect to the wafer in the optical axis direction and detect a height of the second overlay mark based on a change in the signal of the second detector according to a change in the relative position of the objective lens with respect to the wafer in the optical axis direction.

8 Claims, 8 Drawing Sheets

(51) Int. Cl.
  *G03F 7/00* (2006.01)
  *G03F 9/00* (2006.01)
  *H01L 21/67* (2006.01)
(52) U.S. Cl.
  CPC .......... *G03F 7/7085* (2013.01); *G03F 9/7088* (2013.01); *H01L 21/67259* (2013.01)
(58) Field of Classification Search
  CPC ........ G03F 7/7085; G03F 9/7088; G03F 7/20; G03F 7/70575; G03F 7/70825; H01L 21/67259; H01L 21/67242; H01L 22/30
  USPC ................................. 356/399–401, 624, 138
  See application file for complete search history.

(56) References Cited

U.S. PATENT DOCUMENTS

| | | | |
|---|---|---|---|
| 2005/0012928 | A1 | 1/2005 | Sezginer et al. |
| 2008/0013073 | A1* | 1/2008 | Kobayashi ............ G03F 9/7011 356/73 |
| 2010/0182663 | A1* | 7/2010 | Yamakawa .......... G11B 7/0908 359/11 |
| 2017/0148656 | A1* | 5/2017 | Takakuwa ........... G03F 7/70141 |
| 2018/0292198 | A1* | 10/2018 | Manassen .......... G01B 9/02042 |
| 2018/0293720 | A1* | 10/2018 | Yoshitake ................ G03F 7/20 |
| 2022/0035258 | A1* | 2/2022 | Lee ........................... G03F 7/20 |

FOREIGN PATENT DOCUMENTS

| | | |
|---|---|---|
| JP | 08-306602 A | 11/1996 |
| JP | 10-122820 A | 5/1998 |
| JP | 2002-196223 A | 7/2002 |
| JP | 2006350078 A | 12/2006 |
| JP | 2012-094915 A | 5/2012 |
| JP | 2018138906 A | 9/2018 |
| KR | 2003-0054781 A | 7/2003 |
| KR | 10-0689709 B1 | 3/2007 |
| KR | 10-2013-0101458 A | 9/2013 |
| KR | 10-1564312 B1 | 10/2015 |

\* cited by examiner

OVERLAY MEASUREMENT DEVICE

TECHNICAL FIELD

The present invention relates to an overlay measurement device. More particularly, the present invention relates to an overlay measurement device that includes an auto focus system using light sources of different wavelengths.

BACKGROUND ART

Along with technological development, a size of a semiconductor device is reduced, and an increase in the density of an integrated circuit is required. In order to satisfy these requirements, various conditions need to be satisfied. Among them, an overlay tolerance is one of important indicators.

Semiconductor devices are manufactured through numerous manufacturing processes. In order to form an integrated circuit on a wafer, it is necessary to go through many manufacturing processes so that desired circuit structures and elements are sequentially formed at specific positions. The manufacturing processes allows patterned layers to be sequentially formed on the wafer. Through these repeated lamination processes, electrically activated patterns are created in an integrated circuit. At this time, if the respective structures are not aligned within the error range permitted in the manufacturing processes, interference occurs between the electrically activated patterns. This may cause problems in the performance and reliability of the manufactured circuit. An overlay measurement tool is used to measure and verify alignment errors between these layers.

Typical overlay measurement methods measure and verify that the alignment between two layers is within tolerance. As one method, there is a method of forming structures called overlay marks at specific positions on a substrate and imaging the structures with an optical image acquisition device to measure an overlay. The structures for measurement are designed to measure an overlay in at least one of the X-direction and the Y-direction for each layer. The respective structures are designed to be symmetrical, and the center value between the structures arranged in the symmetrical direction is calculated and used as a representative value of the layer, and an overlay error is derived by calculating the relative difference between the representative values of the respective layers.

In the case of measuring an overlay of two layers, as shown in FIGS. 1 and 2, a first overlay mark 1 having a generally box shape and a second overlay mark having a smaller box shape than the first overlay mark 1 are formed on two consecutive layers, respectively. Thereafter, as shown in FIGS. 3 and 4, a waveform representing a change in intensity for each position of a signal obtained by using the first overlay mark 1 as a focal plane is acquired to acquire a center value C1 of the first overlay mark 1, and a waveform representing a change in intensity for each position of a signal obtained by using the second overlay mark 2 as a focal plane is acquired to acquire a center value C2 of the second overlay mark 2, thereby measuring an overlay error between two layers.

However, this method has a problem in that the heights of the first overlay mark 1 and the second overlay mark 2 are measured by an auto focus device using a single light source, without considering the fact that the first overlay mark 1 and the second overlay mark 2 are formed of different materials on different layers and the first overlay mark 1 is covered by a layer on which the second overlay mark 2 is formed.

The auto focus device measures the heights of the first overlay mark 1 and the second overlay mark 2 using a change in the magnitude of a detector signal according to the distance from a wafer. For example, the auto focus device can measure the heights of the first overlay mark 1 and the second overlay mark 2 using a change in contrast of an overlay mark image.

FIGS. 5A and 5B are diagrams illustrating a change in the magnitude of a detector signal according to the distance between a wafer and an objective lens when a light source having a single wavelength is used. FIG. 5A shows a case where a light source having a short wavelength is used, and FIG. 5B shows a case where a light source having a long wavelength is used.

As shown in FIGS. 5A and 5B, the first overlay mark 1 is located on a previously formed layer. Therefore, the detector signal using the first overlay mark 1 has the maximum value in a region where the distance between the wafer and the objective lens is short. The second overlay mark 2 is located on a currently formed layer formed above the previously formed layer. Therefore, the detector signal using the second overlay mark 2 has the maximum value in a region where the distance between the wafer and the objective lens is long.

However, as can be noted from FIGS. 5A and 5B, there is a large difference in the magnitude of the maximum value according to the type of light source. When a light source having a short wavelength is used, the maximum value of the detector signal for the second overlay mark 2 is very large, whereas the maximum value of the detector signal for the first overlay mark 1 is very small. Therefore, when the light source having a short wavelength is used, there is a problem in that it is difficult to accurately measure the height of the first overlay mark 1. Conversely, when the light source having a long wavelength is used, there is a problem in that it is difficult to accurately measure the height of the second overlay mark 2.

There is an increasing demand for solving these problems at the present time at which due to the development of semiconductor processing technology, it is necessary to accurately measure an overlay error between layers having a large height difference and different optical properties.

PRIOR ART DOCUMENT

Patent Document 1: Korean Patent Application Publication No. 10-2003-0054781
Patent Document 2: Korean Patent No. 10-0689709
Patent Document 3: Korean Patent No. 10-1564312

DISCLOSURE

Technical Problem

In view of the above-mentioned problems, it is an object of the present invention to provide a novel overlay measurement device capable of accurately measuring an overlay error between layers having a large height difference and different optical properties.

Technical Solution

In order to achieve the above object, the present invention provides an overlay measurement device for measuring an error between a first overlay mark and a second overlay mark respectively formed on different layers formed on a wafer, including: a first light source configured to irradiate a first beam; a first detector configured to acquire a signal by the first beam emitted from the first light source and reflected at a measurement position of the wafer; a second light source configured to irradiate a second beam having a wavelength different from the wavelength of the first beam; a second detector configured to acquire a signal by the second beam emitted from the second light source and reflected at the measurement position of the wafer; an objective lens configured to condense the first beam and the second beam at the measurement position of the wafer and collect the beam reflected at the measurement position; an actuator configured to adjust a relative position of the objective lens with respect to the wafer in an optical axis direction; a control means configured to control the actuator; and a detection means configured to detect a height of the first overlay mark based on a change in the signal of the first detector according to a change in the relative position of the objective lens with respect to the wafer in the optical axis direction and detect a height of the second overlay mark based on a change in the signal of the second detector according to a change in the relative position of the objective lens with respect to the wafer in the optical axis direction.

The device may further include: a hot mirror disposed between the first light source and the objective lens and configured to reflect light having a long wavelength in the first beam emitted from the first light source toward the objective lens.

The device may further include: a cold mirror disposed between the second light source and the objective lens and configured to reflect light having a short wavelength in the second beam emitted from the second light source toward the objective lens.

The device may further include: a first aperture configured to change a form of the first beam emitted from the first light source to a form corresponding to a shape of the first overlay mark.

The device may further include: a second aperture configured to change a form of the second beam emitted from the second light source to a form corresponding to a shape of the second overlay mark.

The device may further include: a first cylinder lens configured to change the first beam emitted from the first light source into a line beam.

The device may further include: a second cylinder lens configured to change the second beam emitted from the second light source into a line beam.

In the device, the first beam may be a beam in an infrared region, and the second beam may be a beam in an ultraviolet region.

Advantageous Effects

Since the overlay measurement device according to the present invention measures the height using light having a different wavelength for each layer, it is possible to accurately measure the height. Accordingly, it is possible to accurately measure an overlay error between layers having a large height difference and different optical properties.

DETAILED DESCRIPTION

Figure 1:
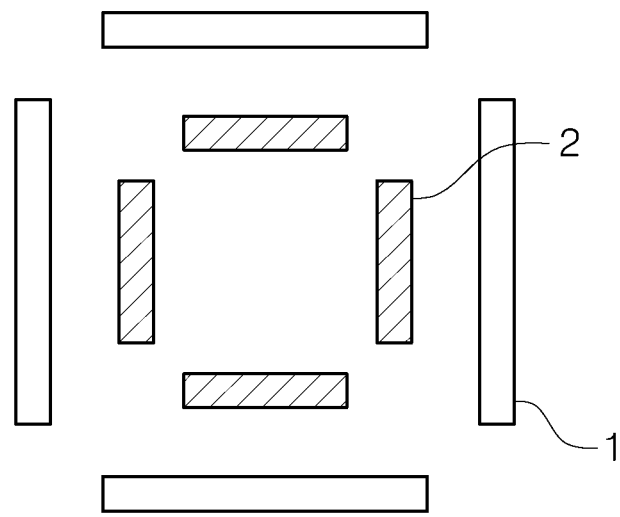
FIG. 1 is a plan view of overlay marks.

Hereinafter, exemplary embodiments of the present invention will be described in detail with reference to the accompanying drawings. However, the embodiments of the present invention may be modified into various other forms, and the scope of the present invention should not be construed as being limited to the embodiments described below. Embodiments of the present invention are provided to more completely describe the present invention to those of ordinary skill in the art. Accordingly, the shapes of elements in the drawings are exaggerated in order to emphasize a clearer description. The elements indicated by the same reference numerals in the drawings mean the same elements.

Figure 6:
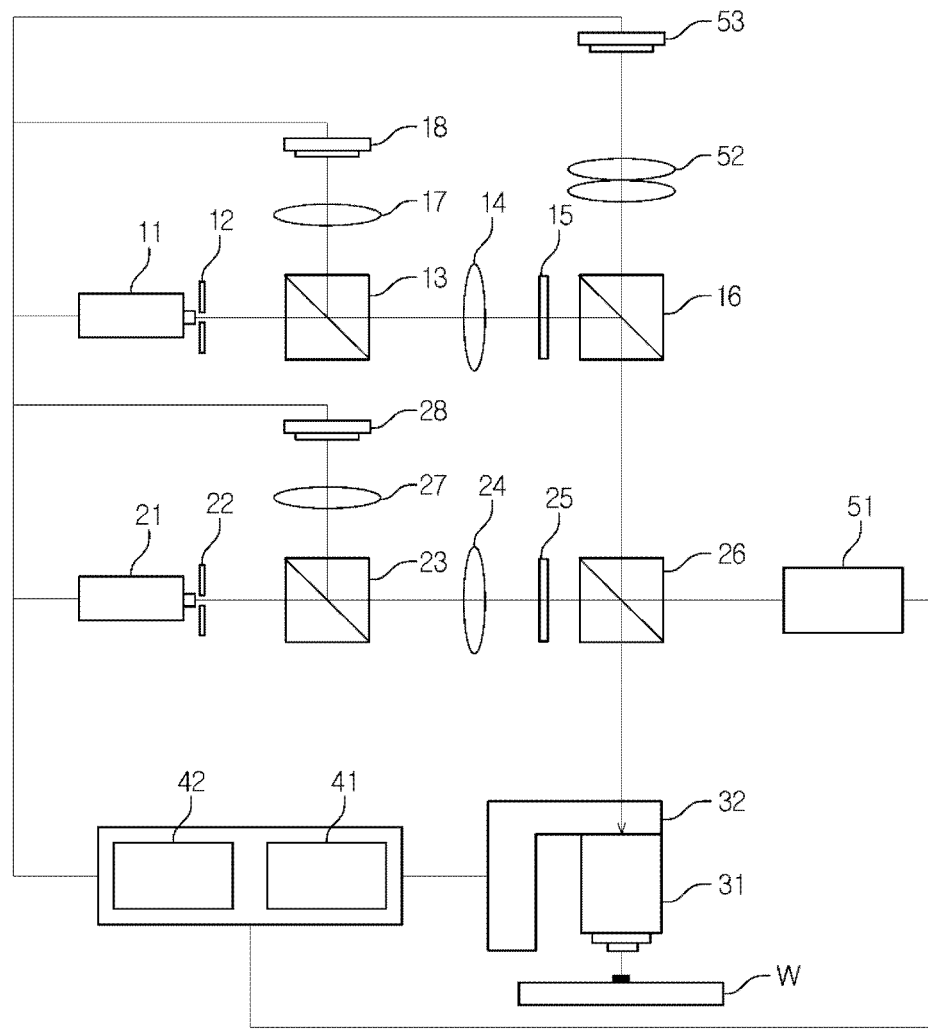
FIG. 6 is a conceptual diagram of an overlay measurement device according to an embodiment of the present invention.

FIG. 6 is a conceptual diagram of an overlay measurement device according to an embodiment of the present invention. The overlay measurement device is a device that measures an error between a first overlay mark and a second overlay mark respectively formed on different layers formed on a wafer w.

Figure 2:
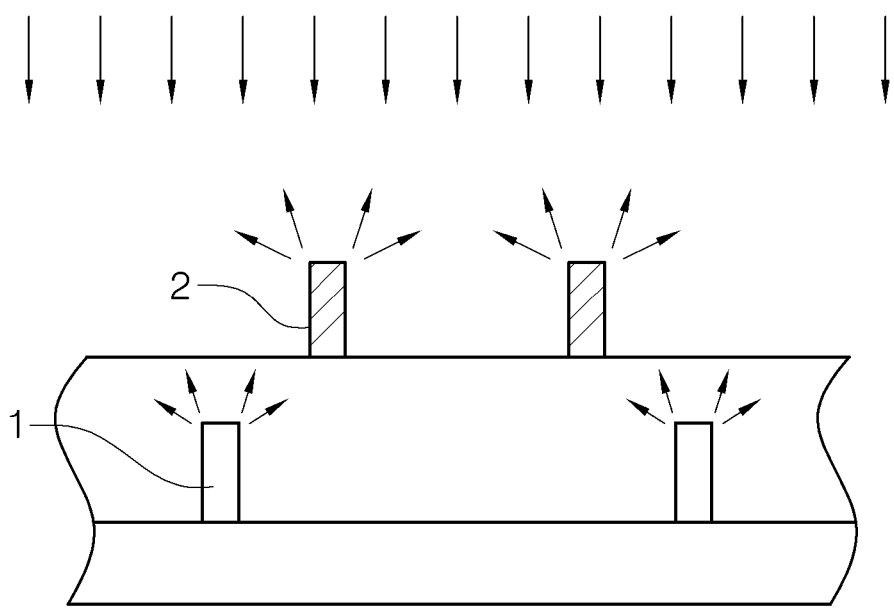
FIG. 2 is a side view of the overlay marks shown in FIG. 1.
Figure 3:
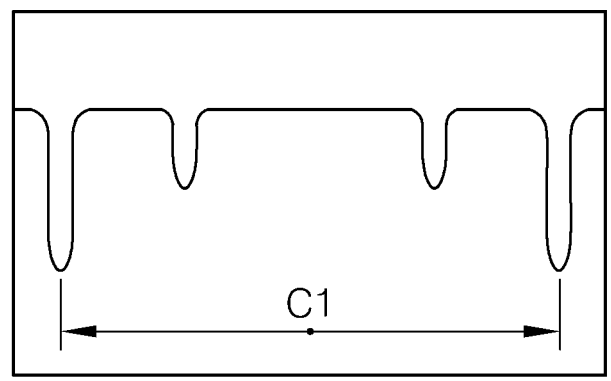
FIG. 3 shows a position-dependent waveform change in the intensity of a signal acquired by using the first overlay mark shown in FIG. 1 as a focal plane.
Figure 4:
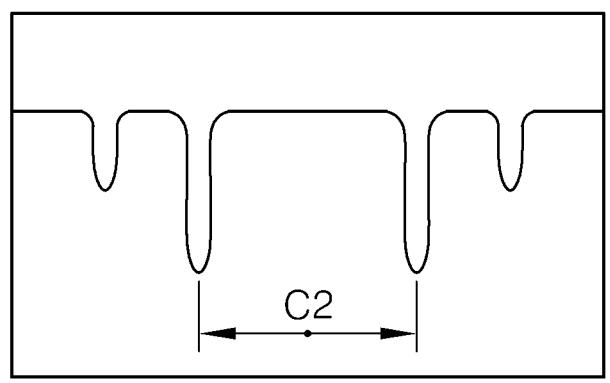
FIG. 4 shows a position-dependent waveform change in the intensity of a signal acquired by using the second overlay mark shown in FIG. 1 as a focal plane.
Figure 5A:
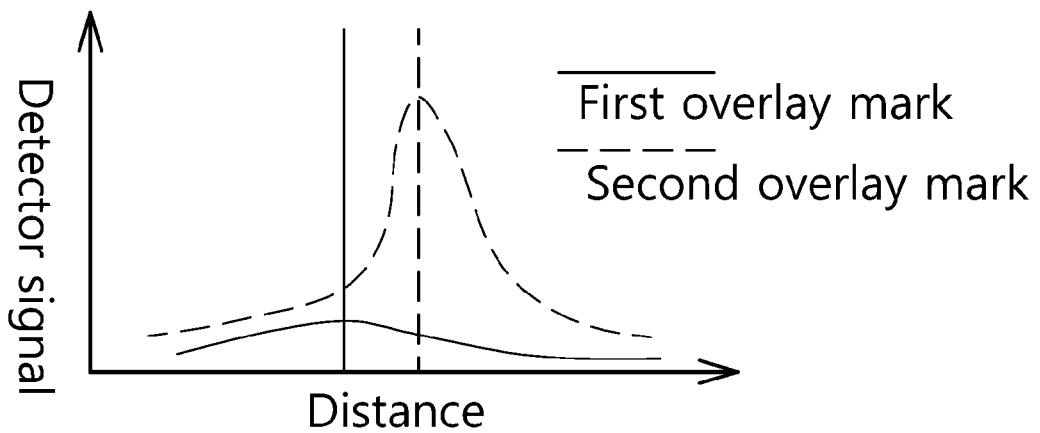
FIGS. 5A and 5B are diagrams illustrating a change in the magnitude of a detector signal according to the distance between a wafer and an objective lens when a light source having a single wavelength is used.
Figure 5B:
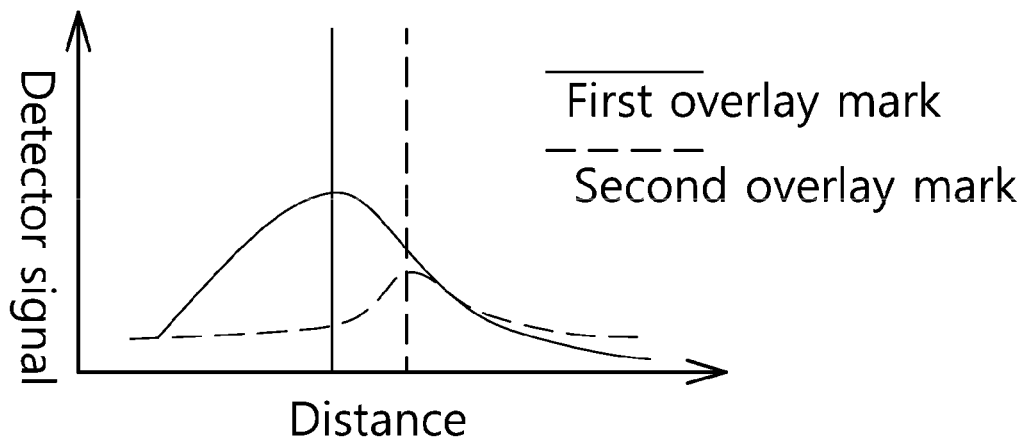

For example, as illustrated in FIGS. 1 and 2, the first overlay mark 1 may be an overlay mark formed on a previous layer, and the second overlay mark 2 may be an overlay mark formed on a current layer. The overlay marks are formed on a scribe line when the layers for forming a semiconductor device are formed in a die region. For example, the first overlay mark 1 may be formed together with an insulating layer pattern, and the second overlay mark 2 may be formed together with a photoresist pattern formed on the insulating layer pattern.

In this case, the second overlay mark 2 is exposed to the outside, but the first overlay mark 1 is covered by a photoresist layer. The first overlay mark 1 is made of an oxide having an optical property different from that of the second overlay mark 2 made of a photoresist material. Furthermore, the heights of the first overlay mark 1 and the second overlay mark 2 are different from each other.

In the present invention, beams having different wavelengths are used to measure the heights of the first overlay mark 1 and the second overlay mark 2. That is, the height of each mark is measured using a beam having a wavelength suitable for the optical property of a material constituting each mark, the height of each mark and the shape of each mark. For example, the height of the first overlay mark 1 may be measured using an infrared beam, and the height of the second overlay mark 2 may be measured using an ultraviolet beam.

As the overlay marks, it may be possible to various types of overlay marks currently used, such as a box-in-box (BIB) overlay mark (see FIG. 1), an advanced imaging metrology (AIM) overlay mark, and the like. Hereinafter, a description will be mainly made based on the box-in-box overlay mark having a simple structure.

As shown in FIG. 6, the overlay measurement device according to an embodiment of the present invention includes a first light source 11, a first beam splitter 13, a hot mirror 16 and a first detector 18, which are used to measure the height of the first overlay mark 1.

Further, the overlay measurement device according to an embodiment of the present invention includes a second light source 21, a second beam splitter 23, a cold mirror 26 and a second detector 28, which are used to measure the height of the second overlay mark 2.

Moreover, the overlay measurement device according to an embodiment of the present invention includes an objective lens 31, an actuator 32, a control means 41 and a height detection means 42, which are commonly used to measure the height of the first overlay mark 1 and the height of the second overlay mark 2.

First, the configuration of the overlay measurement device related to the height measurement of the first overlay mark 1 will be described.

As the first light source 11, it may be possible to use a halogen lamp, a xenon lamp, a supercontinuum laser, a light emitting diode, a laser induced lamp, or the like. The first light source 11 is used as a light source for irradiating light to the first overlay mark 1 formed on the previous layer.

The first beam splitter 13 serves to split the beam emitted from the first light source 11 into two beams. That is, the first beam splitter 13 splits the beam emitted from the first light source 11 into two beams by transmitting a part of the beam emitted from the first light source 11 and reflecting a part of the beam.

The hot mirror 16 is installed to form 45° with respect to the path of the beam passing through the first beam splitter 13. The hot mirror 16 reflects a long-wavelength beam among the beams transmitted through the first beam splitter 13 and transmits a short-wavelength beam.

The objective lens 31 serves to condense the long-wavelength beam reflected from the hot mirror 16 at the measurement position of the wafer W and collect the beam reflected at the measurement position. The objective lens 31 is installed on an actuator 32 configured to linearly move the objective lens 31 along an optical axis direction. The control means 41 controls the actuator 32 to adjust the relative position of the objective lens 31 with respect to the wafer W in the optical axis direction.

The first detector 18 detects the first beam collected by the objective lens 31, transmitted through the cold mirror 26, reflected by the hot mirror 16 and then reflected by the first beam splitter 13.

The height detection means 42 can detect the height of the first overlay mark 1 based on the change in the signal of the first detector 18 according to the change in the relative position of the objective lens 31 with respect to the wafer w in the optical axis direction.

Figure 7:
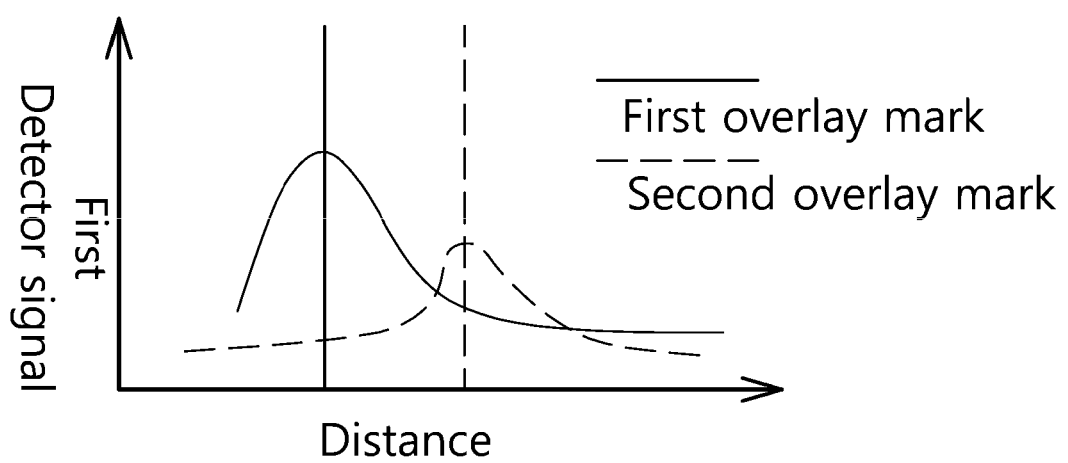
FIG. 7 is a diagram illustrating a change in the magnitude of a first detector signal according to the distance between the wafer and the objective lens when a first light source is used.

For example, as shown in FIG. 7, the change in the magnitude of the signal acquired by the first detector 18 may be checked, and the height of the first overlay mark 1 may be detected by using the relative position of the objective lens 31 with respect to the wafer W in the optical axis direction when the magnitude of the signal is the highest.

As shown in FIG. 7, when the first light source 11 is used, the maximum value of the magnitude of the signal of the first detector 18 by the first overlay mark 1 is larger than the maximum value of the magnitude of the signal of the first detector 18 by the second overlay mark 2. Accordingly, the height of the first overlay mark 1 can be accurately measured by using the first light source 11.

Next, the configuration related to the height measurement of the second overlay mark 2 will be described.

The second light source 21 is similar to the first light source 11 and may be a halogen lamp, a xenon lamp, a supercontinuum laser, a light emitting diode, a laser induced lamp, or the like. The second light source 21 is used as a light source for irradiating light to the second overlay mark 2 formed on the current layer. The beam of the second light source 21 is preferably a beam having a shorter wavelength than the beam of the first light source 11. As described above, the beam of the first light source 11 may be a beam in an infrared region, and the beam of the second light source 21 may be a beam in an ultraviolet region.

The second beam splitter 23 serves to split the beam emitted from the second light source 21 into two beams.

The cold mirror 26 is installed to form an angle of 45° with respect to the path of the beam passing through the second beam splitter 23. The cold mirror 26 reflects the short-wavelength beam among the beams transmitted through the second beam splitter 23 and transmits the long-wavelength beam.

The objective lens 31 condenses the short-wavelength beam reflected from the cold mirror 26 at the measurement position of the wafer W and collects the reflected beam at the measurement position. The control means 41 controls the actuator 32 to adjust the relative position of the objective lens 31 with respect to the wafer W in the optical axis direction.

The second detector 28 detects the second beam collected by the objective lens 31, reflected by the cold mirror 26 and then reflected by the second beam splitter 23.

The height detection means 42 can detect the height of the second overlay mark 2 based on the change of the signal of the second detector 28 according to the change of the relative position of the objective lens 31 with respect to the wafer W in the optical axis direction.

Figure 8:
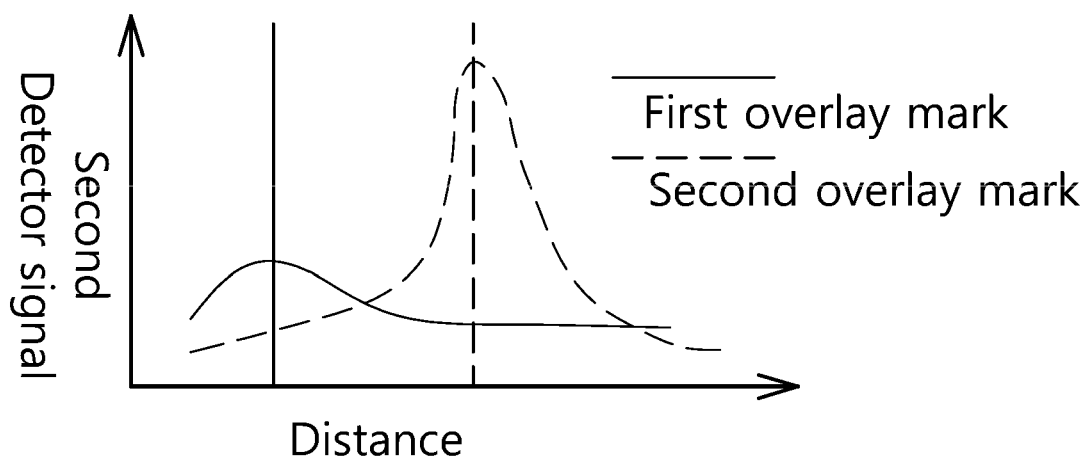
FIG. 8 is a diagram illustrating a change in the magnitude of a second detector signal according to the distance between the wafer and the objective lens when a second light source is used.

For example, as shown in FIG. 8, the change in the magnitude of the signal acquired by the second detector 28 may be checked, and the height of the second overlay mark 2 may be detected by using the relative position of the objective lens 31 with respect to the wafer W in the optical axis direction when the magnitude of the signal is the highest.

As shown in FIG. 8, when the second light source 21 is used, the maximum value of the magnitude of the signal of the second detector 28 by the second overlay mark 2 is significantly larger than the maximum value of the magnitude of the signal of the second detector 28 by the first overlay mark 1. Accordingly, the height of the second overlay mark 2 can be accurately measured by using the second light source 21.

In addition, the overlay measurement device further includes a third light source 51, a third detector 53 and a tube lens 52, which are used to image the first overlay mark 1 and the second overlay mark 2 to measure an overlay error.

The overlay error may be measured in the following manner.

First, the focal plane is positioned between the first overlay mark 1 and the second overlay mark 2 by using the height of the first overlay mark 1 and the height of the second overlay mark 2 obtained previously. The focal plane may be located, for example, in the middle between the first overlay mark 1 and the second overlay mark 2.

Next, images of the first overlay mark 1 and the second overlay mark 2 are acquired at once.

In addition, an overlay error may be measured by comparing the center of the image of the first overlay mark 1 and the center of the image of the second overlay mark 2 with each other.

In addition, an overlay error may be measured by separately acquiring an image of the overlay mark 1 and an image of the second overlay mark 2 and comparing the two images with each other.

In more detail, when imaging the first overlay mark 1, the focal plane is positioned on the first overlay mark 1 using the height of the first overlay mark 1 acquired by the height detection means 42, the beam for image acquisition is irradiated by the third light source 51, and then the reflected beam is detected by the third detector 53 to obtain a clear image of the first overlay mark 1.

Next, when imaging the second overlay mark 2, the focal plane is positioned on the second overlay mark 2 using the height of the second overlay mark 2, and then a clear image of the second overlay mark 2 is acquired.

Then, the center of the image of the first overlay mark 1 and the center of the image of the second overlay mark 2 are compared with each other to measure an overlay error.

In addition, the overlay measurement device further includes a first aperture 12 and a second aperture 22, which are used to measure the height of the first overlay mark 1 and the height of the second overlay mark 2 more accurately.

The first aperture 12 is disposed between the first light source 11 and the first beam splitter 13. The second aperture 22 is disposed between the second light source 12 and the second beam splitter 23.

The first aperture 12 serves to change the first beam into a form suitable for imaging the first overlay mark 1.

Figure 9:
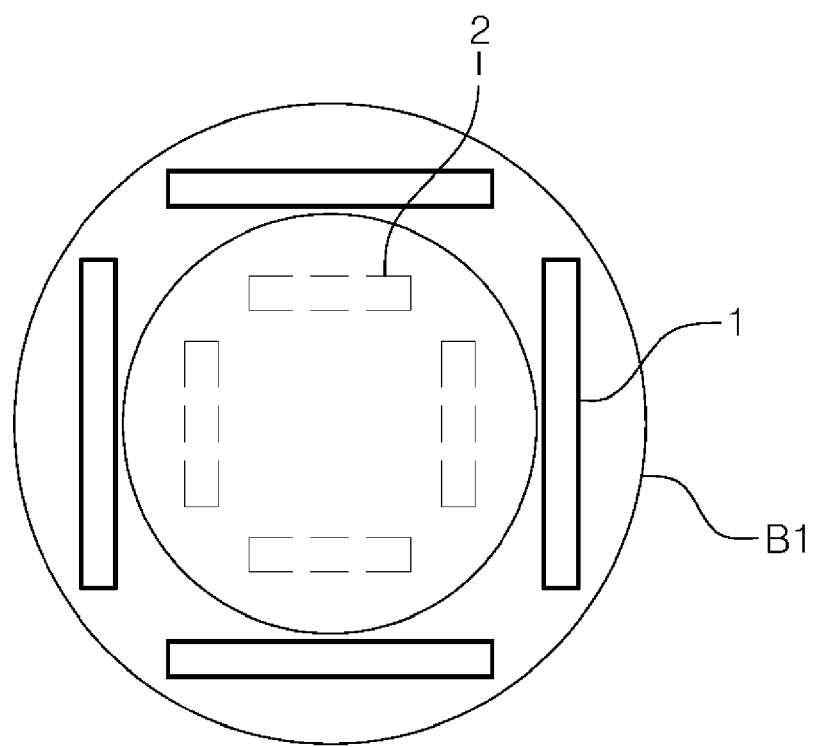
FIG. 9 is a diagram illustrating an example of a first beam.

For example, as shown in FIG. 9, when the first overlay mark 1 is an outer box of a box-in-box (BIB) overlay mark, the first beam B1 may be changed into a donut shape. Since the first overlay mark 1 in the form of a BIB overlay mark has a rectangular frame shape with an empty central portion, there is no need to irradiate the first beam B1 to the central portion.

The second aperture 22 serves to change the second beam into a shape suitable for imaging the second overlay mark 2.

Figure 10:
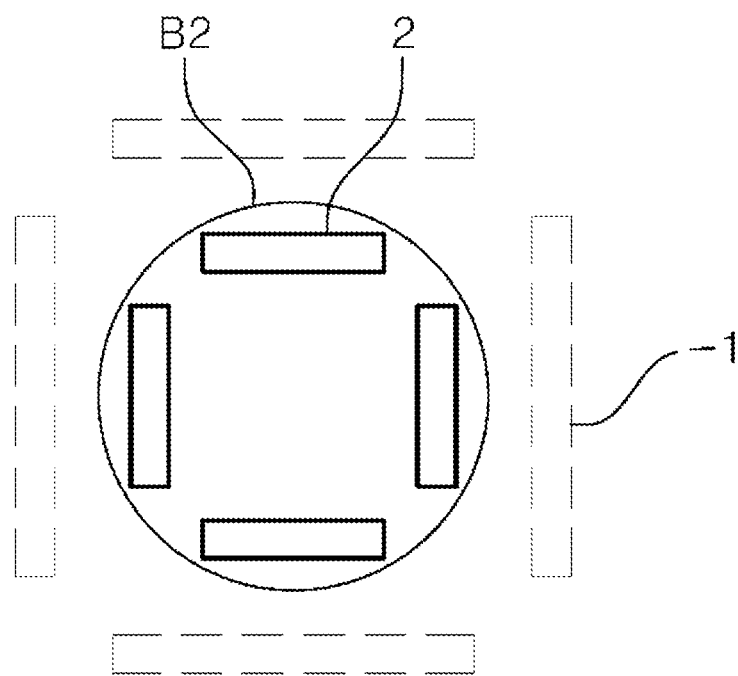
FIG. 10 is a diagram illustrating an example of a second beam.

For example, as shown in FIG. 10, when the second overlay mark 2 is an inner box of a box-in-box (BIB) overlay mark, the second beam B2 may be changed to have a circular shape so that the diameter thereof is approximately equal to the diagonal length of the inner box.

In addition, the overlay measurement device includes a first cylinder lens 14 and a second cylinder lens 15, which are used to measure the height of the first overlay mark 1 and the height of the second overlay mark 2 more accurately.

The cylinder lens is used when a line beam is required. The cylinder lens is a lens having a curved surface only on one side. The beam passing through the cylinder lens becomes a line beam. When the line beam is used, the sensitivity is increased due to optical aberration (astigmatism), which makes it possible to measure the height more precisely.

In addition, the overlay measurement device may further include polarization plates (waveplates) 15 and 25 arranged on the front side of the hot mirror 16 and the cold mirror 26 to change the light passing therethrough into a polarized state, and lenses 17 and 27 arranged on the front side of the first detector 18 and the second detector 28 to collect light.

The embodiment described above is merely illustrative of a preferred embodiment of the present invention. The scope of the present invention is not limited to the described embodiment. Those skilled in the art may make various changes, modifications, or substitutions within the technical spirit of the present invention and the claims. Such changes, modifications, or substitutions should be understood to fall within the scope of the present invention.

The invention claimed is:

1. An overlay measurement device for measuring an error between a first overlay mark and a second overlay mark respectively formed on different layers formed on a wafer, comprising:
    a first light source configured to irradiate a first beam;
    a first detector configured to acquire a signal by the first beam emitted from the first light source and reflected at a measurement position of the wafer;
    a second light source configured to irradiate a second beam having a wavelength different from the wavelength of the first beam;
    a second detector configured to acquire a signal by the second beam emitted from the second light source and reflected at the measurement position of the wafer;
    an objective lens configured to condense the first beam and the second beam at the measurement position of the wafer and collect the beam reflected at the measurement position;
    an actuator configured to adjust a relative position of the objective lens with respect to the wafer in an optical axis direction;
    a controller configured to control the actuator; and
    a detector configured to detect a height of the first overlay mark based on a change in the signal of the first detector according to a change in the relative position of the objective lens with respect to the wafer in the optical axis direction and detect a height of the second overlay mark based on a change in the signal of the second detector according to a change in the relative position of the objective lens with respect to the wafer in the optical axis direction.

2. The device of claim 1, further comprising:
    a hot mirror disposed between the first light source and the objective lens and configured to reflect a light having a long wavelength in the first beam emitted from the first light source toward the objective lens.

3. The device of claim 1, further comprising:
    a cold mirror disposed between the second light source and the objective lens and configured to reflect a light having a short wavelength in the second beam emitted from the second light source toward the objective lens.

4. The device of claim 1, further comprising:
    a first aperture configured to change a form of the first beam emitted from the first light source to a form corresponding to a shape of the first overlay mark.

5. The device of claim 1, further comprising:
    a second aperture configured to change a form of the second beam emitted from the second light source to a form corresponding to a shape of the second overlay mark.

6. The device of claim 1, further comprising:
    a first cylinder lens configured to change the first beam emitted from the first light source into a line beam.

7. The device of claim 1, further comprising:
a second cylinder lens configured to change the second beam emitted from the second light source into a line beam.

8. The device of claim 1, wherein the first beam is a beam in an infrared region, and the second beam is a beam in an ultraviolet region.

* * * * *